United States Patent
Leung et al.

(10) Patent No.: US 9,219,496 B1
(45) Date of Patent: Dec. 22, 2015

(54) EFFICIENT LOSSLESS DATA COMPRESSION SYSTEM, DATA COMPRESSOR, AND METHOD THEREFOR

(71) Applicant: Advanced Micro Devices, Inc., Sunnyvale, CA (US)

(72) Inventors: Kevin G. Leung, Santa Clara, CA (US); Dhanaraj Bapurao Tavare, Cupertino, CA (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 0 days.

(21) Appl. No.: 14/462,243

(22) Filed: Aug. 18, 2014

(51) Int. Cl.
*H03M 7/30* (2006.01)
*G06F 9/45* (2006.01)

(52) U.S. Cl.
CPC .. *H03M 7/30* (2013.01); *G06F 8/41* (2013.01)

(58) Field of Classification Search
CPC ......... G06F 8/41; G06F 3/162; G06F 3/0237; G06F 3/0219; G06F 3/0482; G06F 1/0356; G06F 21/31; H03M 7/30; H03M 7/4006; H03M 11/08; H04L 63/06; H04L 63/0861; H04L 63/0853; H03K 21/00
USPC ........ 341/65, 67, 87, 107, 176; 708/672, 706, 708/700
See application file for complete search history.

(56) References Cited

U.S. PATENT DOCUMENTS

| | | | | |
|---|---|---|---|---|
| 5,274,581 A | | 12/1993 | Cliff et al. | |
| 5,490,258 A | * | 2/1996 | Fenner | H03M 7/4006 707/999.001 |
| 5,892,503 A | * | 4/1999 | Kim | G06F 3/162 341/22 |
| 6,307,547 B1 | * | 10/2001 | Bolnick | G06F 3/0482 715/775 |
| 6,307,548 B1 | * | 10/2001 | Flinchem | G06F 3/0237 341/22 |
| 7,649,478 B1 | * | 1/2010 | Yoon | H03M 11/08 341/107 |
| 2010/0109930 A1 | * | 5/2010 | Maier | G06F 21/31 341/176 |

* cited by examiner

*Primary Examiner* — Lam T Mai
(74) *Attorney, Agent, or Firm* — Polansky & Associates, P.L.L.C.; Paul J. Polansky

(57) ABSTRACT

A data compressor for a lossless data compression system includes a hardware aware encoder and a key signal processor. The hardware aware encoder encodes a data value signal into a key signal according to a key assignment formed by determining a number of data values of a value space in which each data value comprises a plurality of bits, determining a size of the key to encode the number of data values of the value space, grouping the data values into a plurality of groups based on a fewest number of bit differences between data values in each group, and assigning fragments of the key based on a fewest number of bits that can differentiate groups based on remaining bits of the data values. The key signal processor has an output adapted to be coupled to a medium for providing a representation of the key signal to the output.

20 Claims, 3 Drawing Sheets

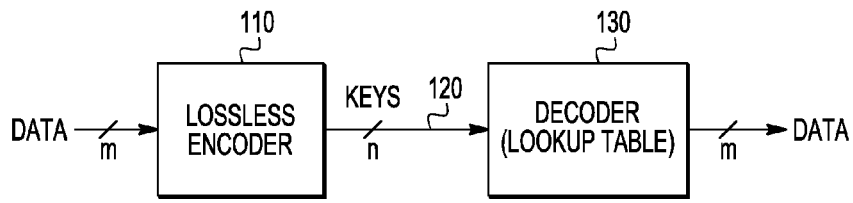
100 FIG. 1
- PRIOR ART -
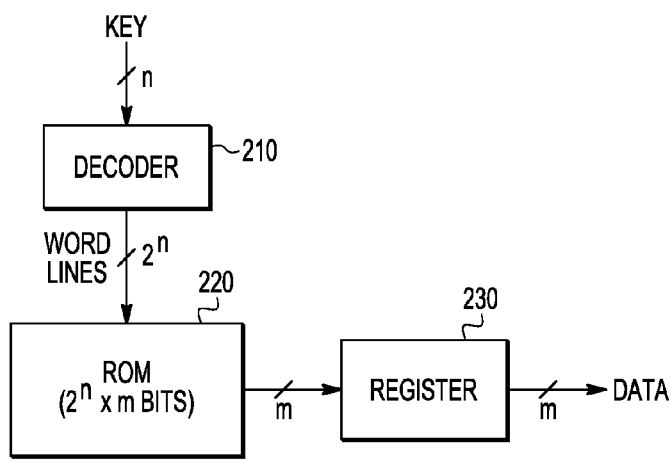
200 FIG. 2
- PRIOR ART -
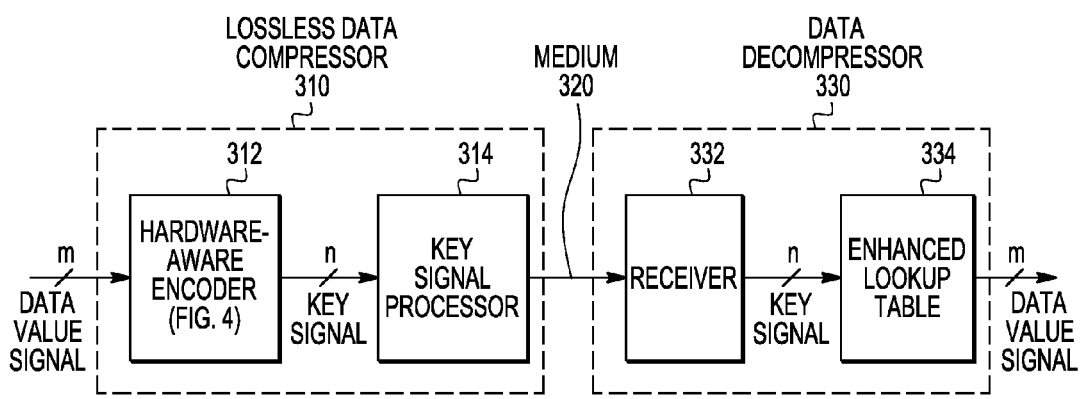
300 FIG. 3

EFFICIENT LOSSLESS DATA COMPRESSION SYSTEM, DATA COMPRESSOR, AND METHOD THEREFOR

FIELD

This disclosure relates generally to data encoding, and more specifically to lossless data compression.

BACKGROUND

Many different types of data systems use data compression. Data compression involves encoding of information using fewer bits than the original representation. Data compression is useful because it helps reduce the usage of scarce resources, such as data storage space or transmission capacity. Data compression can be either lossless or lossy. In lossy data compression systems, such as video or audio compression, some loss of information is tolerable. In lossless data compression, however, all of the original information is preserved. Lossless compression is used in cases in which it is important that the original and the decompressed data be identical, or when deviations from the original data could be deleterious. Typical examples of lossless data compression are executable programs, text documents, and source code. Some image file formats, like PNG or GIF, use only lossless compression, while others like TIFF and MNG may use either lossless or lossy methods. Lossless audio formats are most often used for archiving or production purposes, while smaller lossy audio files are typically used on portable players and in other cases where storage space is limited or exact replication of the audio is unnecessary.

Because lossless compression requires exact replication of the original data, the way the data is encoded can affect the size of the circuitry required to decode the data to its original format and the speed at which the decompression takes place.

BRIEF DESCRIPTION OF THE DRAWINGS

FIG. 1 illustrates in block diagram form a lossless data compression system known in the prior art.

FIG. 2 illustrates in block diagram form a lookup table known in the prior art suitable for use in the lossless data compression system of FIG. 1.

FIG. 3 illustrates in block diagram form a lossless data compression system according to some embodiments.

Figure 4:
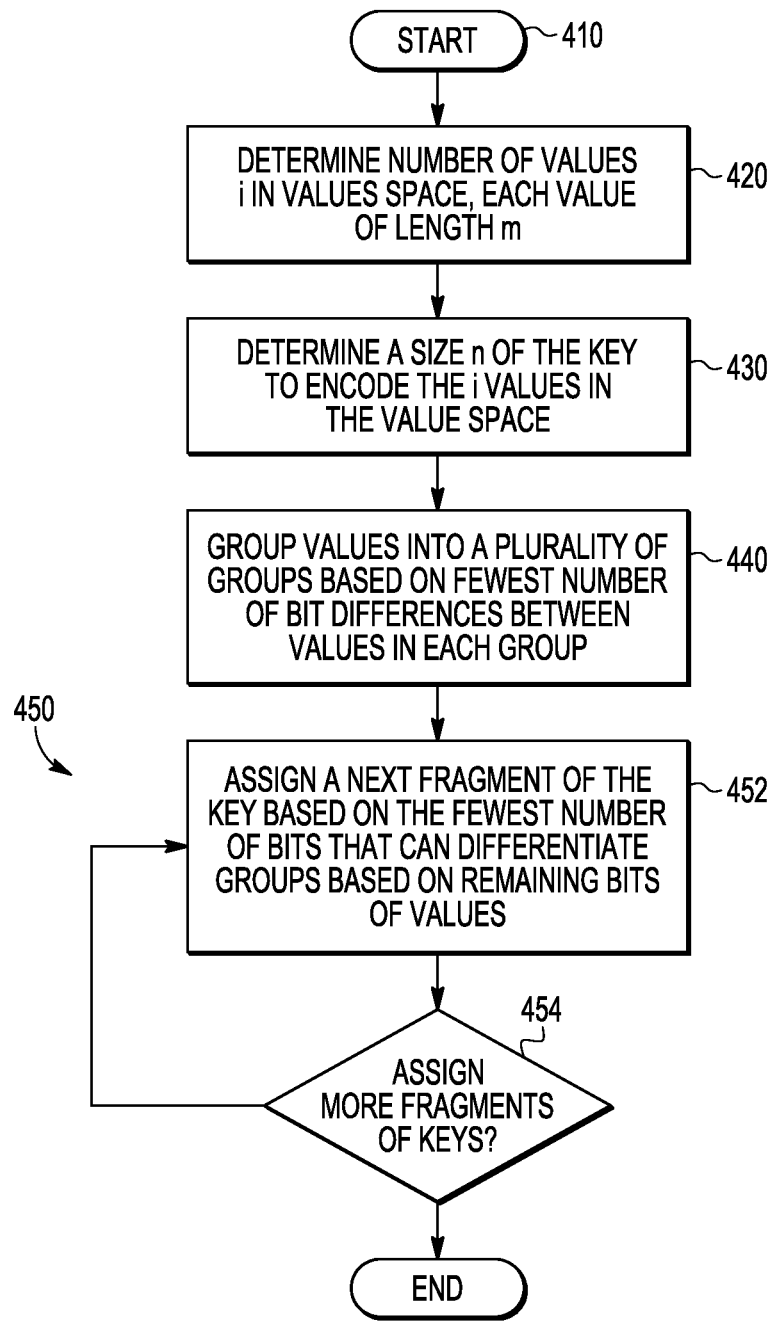
FIG. 4 illustrates a flow chart of a key assignment that can be used with the hardware aware encoder of FIG. 3 according to some embodiments.

In the following description, the use of the same reference numerals in different drawings indicates similar or identical items. Unless otherwise noted, the word "coupled" and its associated verb forms include both direct connection and indirect connection by means known in the art, and unless otherwise noted any description of direct connection implies alternate embodiments using suitable forms of indirect connection as well.

DETAILED DESCRIPTION OF ILLUSTRATIVE EMBODIMENTS

In one form, a data compressor for a lossless data compression system includes a hardware aware encoder and a key signal processor. The hardware aware encoder encodes a data value signal into a key signal according to a key assignment. The key assignment is formed by determining a number of data values of a value space in which each data value comprises a plurality of bits, determining a size of the key to encode the number of data values of the value space, grouping the data values into a plurality of groups based on a fewest number of bit differences between data values in each group, and assigning fragments of the key based on a fewest number of bits that can differentiate groups based on remaining bits of the data values. The key signal processor has an output adapted to be coupled to a medium, and provides a representation of the key signal to the output. By using a key assignment that takes into account the complexity of the circuitry needed for the decompression, the data compressor simplifies the logic needed to implement the decompressor.

In some embodiments, a lossless data compression system includes a data compressor and a medium. The data compressor includes a hardware aware encoder and a key signal processor. The hardware aware encoder encodes a data value signal into a key signal according to a key assignment. The key assignment is formed by determining a number of data values of a value space in which each data value comprises a plurality of bits, determining a size of the key to encode the number of data values of the value space, grouping the data values into a plurality of groups based on a fewest number of bit differences between data values in each group, and assigning fragments of the key based on a fewest number of bits that can differentiate groups based on remaining bits of the data values. The key signal processor provides a representation of the key signal to the medium. In some embodiments, the data compression system further includes a data decompressor including a receiver and an enhanced lookup table. The receiver has an input coupled to the medium, and an output for providing the key signal. The enhanced lookup table has an input coupled to the output of the receiver, and an output for providing the data value signal, wherein the enhanced lookup table converts the key signal to the data value signal using the key assignment.

In some embodiments, a method includes receiving a data value signal. The data value signal is encoded into a key signal based on a key assignment. The key assignment includes determining a number of data values of a value space in which each data value comprises a plurality of bits, determining a size of a key to encode the number of data values of the value space, grouping the plurality of data values into a plurality of groups based on a fewest number of bit differences between data values in each group, and assigning fragments of the key based on a fewest number of bits that can differentiate groups based on remaining bits of data values. A representation of the key signal is provided to a medium.

FIG. 1 illustrates in block diagram form a lossless data compression system 100 known in the prior art. Lossless data compression system 100 includes a lossless encoder 110 and a decoder 130 which are connected together by a medium 120. Encoder 110 has an input for receiving an m-bit signal labeled "DATA" which it encodes into a smaller value labeled "KEY" of width n and provides the KEY to an output for transmission over medium 120. Decoder 130 has an input connected to medium 120, and decodes the n-bit KEY into the original m-bit DATA signal which it provides to an output thereof. In order to realize a coding gain, n<m. Decoder 130 is frequently implemented using a lookup table in which the keys select an entry of the table or are otherwise decoded into the original DATA. In some systems, lossless encoder 110 also transmits a dictionary to decoder 130 to define the correspondence between the KEYS and the DATA.

FIG. 2 illustrates in block diagram form a lookup table 200 known in the prior art suitable for use in lossless data compression system 100 of FIG. 1. Lookup table 200 includes a decoder 210, a read only memory (ROM) 220, and a register 230. Decoder 210 has an input for receiving the n-bit KEY signal, and an output connected to $2^n$ wordlines for providing select signals thereto. ROM 220 has a row input connected to the output of decoder 210, and an output for providing an m-bit signal. Register 230 has an input connected to the output of ROM 220, and an output for providing the m-bit DATA signal.

Decoder 210 provides a full 1-to-2n decoding of the KEY signal. Moreover ROM 220 is organized as $2^n$ rows by m bits such that each row causes ROM 220 to output an m-bit value. In addition, ROM 220 may have sense amplifiers corresponding to each of the outputs. Thus lookup table 200 consumes a significant amount of circuit area.

FIG. 3 illustrates in block diagram form a lossless data compression system 300 according to some embodiments. Lossless data compression system 300 includes a lossless data compressor 310 and a data decompressor 330 which are connected together by a medium 320. Lossless data compressor 310 includes a hardware-aware encoder 312 and a key signal processor 314. Hardware-aware encoder 312 has an input for receiving the m-bit DATA VALUE signal, and an output for providing n-bit KEY signal. Key signal processor 314 has an input connected to the output of hardware-aware encoder 312, and an output adapted to be connected to medium 320.

Data decompressor 330 includes a receiver 332 and an enhanced lookup table 334. Receiver 332 has an input adapted to be connected to medium 320, and an output for providing the KEY signal. Enhanced lookup table 334 has an input connected to the output of receiver 332, and an output for providing the m-bit DATA VALUE signal.

Medium 320 can assume various forms. For example, lossless data compressor 310 can communicate with data decompressor 330 through the air using a wireless communication protocol. In this case, key signal processor 314 would modulate the KEY signal onto a carrier signal using frequency mixing and radiate the modulated signal through the air using a power amplifier and an antenna. In this example receiver 332 would also have an antenna and demodulate the data using a local mixer. In another example, medium 320 can be a digital storage medium such as non-voltage memory or disk storage. In this example, key signal processor 314 would write the data using data storage techniques, and receiver 332 would read the data from the storage medium. In another example, medium 320 could be a memory device that stores microprocessor instructions that data decompressor 330 reads and decodes into a set of control signals for controlling various hardware resources inside a microprocessor. In yet another example, the medium could be a conductor and/or a register inside an instruction decoder.

Lossless data compression system 300 realizes a coding gain when n<m. Thus the value space of the set of m-bit values has fewer possibilities than $2^m$ bits. Unlike known lossless compression systems, however, hardware-aware encoder 312 exploits similarities between the KEYs and the DATA VALUEs in the value space to reduce the amount of hardware required for enhanced lookup table 334. It implements a KEY assignment that reduces the size and complexity of enhanced lookup table 334 to provide an efficient mapping between the KEYs and the DATA VALUEs. Thus data decompressor 330 is smaller in area and decodes the KEYs faster. How the key assignment can be determined will now be described.

FIG. 4 illustrates a flow chart of a key assignment 400 that can be used with hardware-aware encoder 312 of FIG. 3 according to some embodiments. Key assignment 400 will be explained using a simple example of a value space consisting of the following five 6-bit VALUEs: 111101, 111100, 100100, 100110, and 011011. A typical method of assigning KEYs to these five numbers would be to use a binary progression of 000, 001, 010, 011, and 100 to correspond to 111101, 111100, 100100, 100110, and 011011, respectively. However key assignment 400 reduces the number of dependencies and thus the logic complexity of data decompressor 330 to translate the KEYs to the original VALUES in enhanced lookup table 334.

Flow starts at box 410. An action box 420 determines the number of values i in the VALUE space, in which each data VALUE is of length m. If the VALUE space is sparse, n<<m, and fewer KEYs will be required resulting in better coding gain. In the current example, i=5.

An action box 430 determines the number of bits of the KEY signal n needed to decode the i values in the VALUE space. For example, n could be determined by rounding up to the next whole number the logarithm of i, base 2. In the current example, $\log_2(5) \approx 2.322$, which is rounded up to 3, so n=3. Note that $2^3=8$, which is sufficient to encode five VALUEs.

An action box 440 groups the VALUEs in the value space into a plurality of groups based on the fewest number of bit differences between VALUEs in a group. In the current example, two pairs of VALUEs that have only a single bit difference between them can be grouped together, with the fifth VALUE occupying a separate group, as shown in TABLE I:

TABLE I

| Group # | Original VALUEs | Remaining Common Bits | Number of bit differences |
|---|---|---|---|
| 1 | 011011 | N/A | N/A |
| 2 | 100100, 100110 | 1001y1 | 1 |
| 3 | 111100, 111101 | 11110y | 1 | in which "y" represents VALUE bits that vary within the group. Note that the VALUEs in Group 2 differ from each other only in bit position 1, and the VALUEs in Group 3 differ from each other only in bit position 0, in which the bit positions are ordered left-to-right from most significant (bit position 5) to least significant (bit position 0).

A set of steps 450 performs key assignment and includes an action box 452 and a decision box 454. Action box 452 assigns a next fragment of the KEY based on the fewest number of bits that can differentiate groups based on the remaining bits of the i VALUEs, in which a fragment is a portion of a KEY including one or more bits. Decision box 454 determines whether to assign more fragments of the KEYs.

In the current example key assignment starts with the original VALUEs listed in TABLE I above. At this stage the fewest number of bits that can differentiate the groups is one bit that can differentiate two bit positions of the VALUE, namely bit positions 5 and 2. Bit position 2 of the KEY is used to differentiate between groups in which bits 5 and 2 are 0b (i.e. Group 1) from groups in which bits 5 and 2 are 1b (i.e. Groups 2 and 3). Note that the bit of the KEY is assigned to a logic state corresponding to the logic state of the bits that can differentiate between the data values in the group to simplify decoding. If the lookup function is expressed generally as lookup(KEY)=VALUE, then the partial key lookup function at this step can be expressed as lookup(0xx)=0xx0xx and lookup(1xx)=1xx1xx, in which an "x" represents a don't care. The assignment of the first fragment of the KEY (bit 2) is shown in TABLE II below:

TABLE II

| Group # | Original VALUEs | Partial KEY | Remaining Bits |
| --- | --- | --- | --- |
| 1 | 011011 | 0xx | z11z11 |
| 2 | 100100, 100110 | 1xx | z00z00, z00z10 |
| 3 | 111100, 111101 | 1xx | z11z00, z11z01 | in which "z" represents VALUE bits that are determined by the first fragment of the key. Decision box 454 determines that after the assignment of the first fragment of the KEY, more fragments of the KEY remain to be assigned, and returns the flow to action box 452.

Action box 452 then determines that the fewest number of bits that can differentiate groups based on the remaining four bits of the VALUES is again equal to one that can differentiate two bit positions of the VALUE, namely bit positions 4 and 3. Bit position 1 of the KEY is used to differentiate between groups in which bits 4 and 3 are 0b (i.e. Group 2) from groups in which bits 4 and 3 are 1b (i.e. Groups 1 and 3). Thus the partial key lookup function at this step can be expressed as lookup(x0x)=x00xxx and lookup(x1x)=x11xxx. The assignment of the second fragment of the KEY is shown in TABLE III below:

TABLE III

| Group # | Remaining Bits | Partial KEY | Remaining Bits |
| --- | --- | --- | --- |
| 1 | z11z11 | 01x | zzzz11 |
| 2 | z00z00, z00z10 | 10x | zzzz00, zzzz10 |
| 3 | z11z00, z11z01 | 11x | zzzz00, zzzz01 |

Decision box 454 determines that after the assignment of the second fragment of the KEY, more fragments of the KEY remain to be assigned, and returns the flow to action box 452.

Action box 452 then determines that that the fewest number of bits that can differentiate groups is equal to three based on the remaining four bits of the VALUEs, namely bit positions 1 and 0. The assignment of the additional fragments is done based on the previously assigned bits of the KEY until all VALUEs have unique KEYs. Thus the partial key lookup using the next four fragments can be expressed as lookup (xx0)=xxxx00, lookup(011)=xxxx11, lookup(101)=xxxx10, and lookup(111)=xxxx01. The final KEY assignments are shown in TABLE IV below:

TABLE IV

| VALUE in value space | Key |
| --- | --- |
| 011011 | 011 |
| 100100 | 100 |
| 100110 | 101 |
| 111100 | 110 |
| 111101 | 111 |

Thus a lookup of a key in the table would produce partial sequences of ones and zeros which would be added up for each digit position to reproduce the original VALUE. Decision box 454 then determines that after the assignment of the last four fragments of the KEY, all VALUEs have been assigned to a unique KEY and no more fragments of the KEY remain to be assigned, and the flow terminates at box 460.

Hardware-aware encoder 312 uses key assignment 400 to encode the DATA VALUE signal into the KEY signal. The encoding function can be expressed generally as revlookup (VALUE)=KEY. For example in response to the DATA VALUE signal being equal to 100110, hardware-aware encoder 312 outputs 101 as the KEY signal. In some embodiments, hardware-aware encoder 312 can perform an implied lookup function. For example, if hardware-aware encoder 312 is an assembly language compiler, then an instruction in a program written in an assembly language mnemonic can imply the VALUE and can be translated directly into the KEY signal that the VALUE corresponds to according to the key assignment.

The key assignment is done based on a mapping between the VALUEs and the KEYs that reduces complexity in enhanced lookup table 334. Most digits in the VALUE depend on less than all digits of the KEY, simplifying the logic needed in enhanced lookup table 334. The size and complexity of enhanced lookup table 334 depends on the number of VALUEs in the value space and the dependencies of the bits. Fewer dependencies reduce logic complexity and area and processing time.

Figure 5:
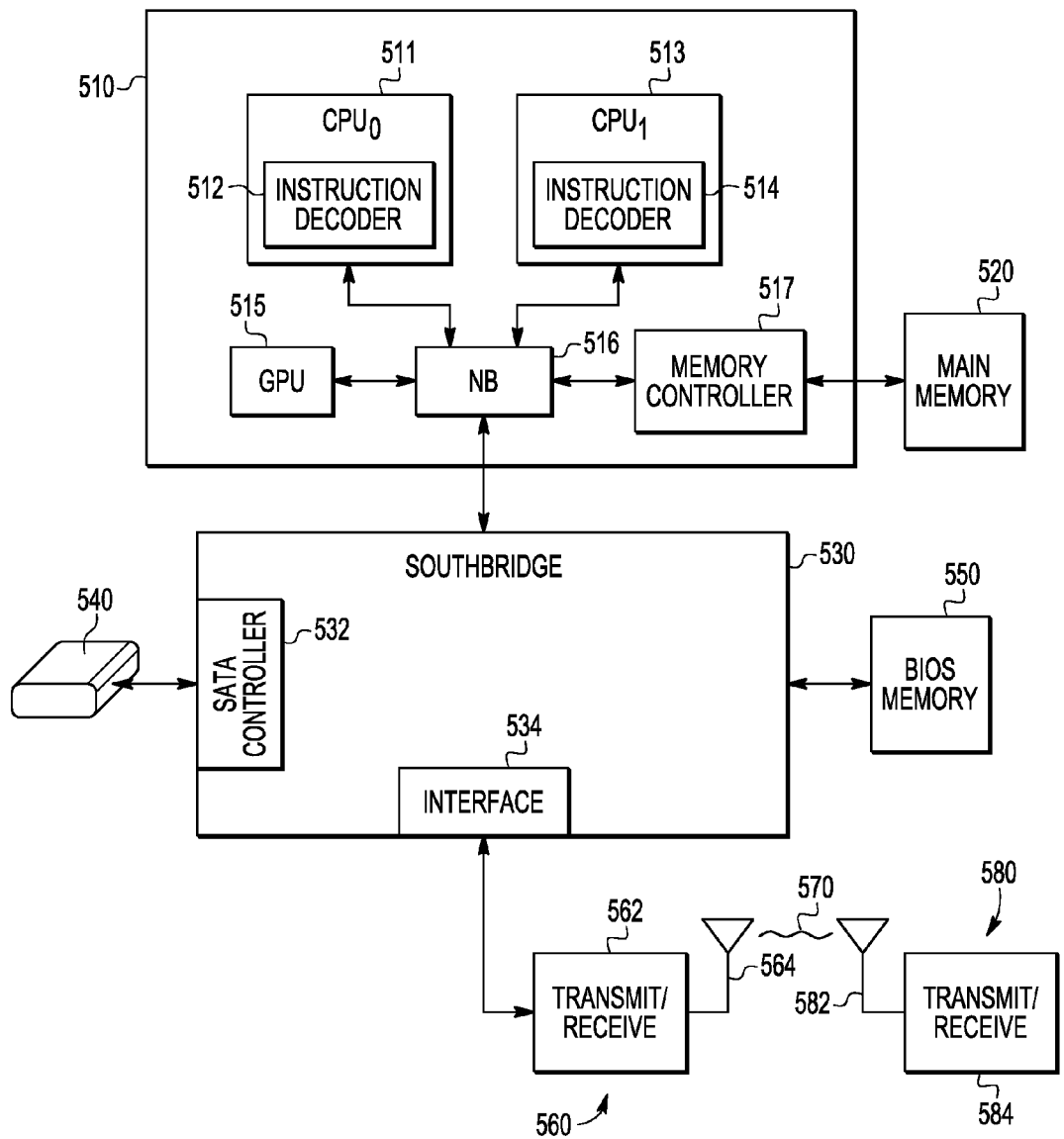
FIG. 5 illustrates in block diagram form a computer system in which the lossless data compression system of FIG. 3 may be used.

FIG. 5 illustrates in block diagram form a computer system 500 in which lossless data compression system 300 of FIG. 3 may be used. Computer system 500 generally includes an accelerated processing unit (APU) 510, a main memory 520, a system controller chip known as a "Southbridge" 530, a SATA (Serial Advanced Technology Attachment) mass storage system 540, a BIOS (Basic Input Output System) memory 550, a local radio circuit 560 connected to a remote radio circuit 580 over a radio frequency (RF) transmission medium 570.

APU 510 generally includes central processing unit (CPU) cores 511 and 513 labeled "CPU$_0$" and "CPU$_1$", respectively, a system controller known as a "Northbridge" 516, a graphics processing unit (GPU) 515, and a memory controller 517. CPU core 511 has a bidirectional port connected to a bidirectional port of Northbridge 516 over a bidirectional bus and includes an instruction decoder 512 for decoding instructions encoded in its native instruction set. CPU core 513 has a bidirectional port connected to a bidirectional port of Northbridge 516 over a bidirectional bus and includes an instruction decoder 514 for decoding instructions in its native instruction set. Northbridge 516 has three additional bidirectional ports, including a first bidirectional port connected to a bidirectional port of GPU 515, a second bidirectional port connected to a bidirectional port of memory controller 517, and a third bidirectional port connected to a bidirectional port of Southbridge 530. Memory controller 517 has a bidirectional port connected to main memory 520 over a bidirectional DRAM memory system bus.

Southbridge 140 generally includes a SATA controller 523 and a peripheral interface 534 labeled "INTERFACE". SB 530 has a bidirectional port connected to a bidirectional port of BIOS memory 550 over a bidirectional bus. SATA controller 532 has a bidirectional port connected to a bidirectional port of SATA mass storage system 540 over a bidirectional bus. Interface 534 has a bidirectional port connected to local radio circuit 560. In general, Southbridge 530 interfaces computer system 500 to various low-speed peripherals in a conventional manner.

In the illustrated embodiment, local radio circuit 560 includes a transmit/receive block 562 and an antenna 564. Remote radio circuit 580 includes an antenna 582 and a transmit/receive block 584. In the illustrated embodiment, local radio circuit 560 operates as a key signal processor and provides an interface in which the radio signals are sent through the air to and from a remote location. One example would be an 802.11(g) link between computer system 500 and the internet in which remote radio circuit 580 is part of a wireless router that has another connection to the internet.

There are several ways in which computer system 500 can use the lossless data compression system as disclosed in FIGS. 3 and 4 above. First, memory devices such as main memory 520, BIOS memory 550, and SATA mass storage system 540 store instructions and data for use by $CPU_0$ or $CPU_1$. These instructions are encoded in an instruction set associated with APU 510 that maps certain desired operations to opcodes (either fixed-length or variable length). The opcodes cause the execution circuitry to perform certain operations. For example, an ADD instruction may add the contents of one register to a second register and place the results of the addition in the first register. The ADD instruction would be decoded into a set of control signals based on the CPU core's microarchitecture. To the extent the instruction set encodings are not yet defined, they can use key encoding 400 of FIG. 4 to simplify the construction of instruction decoders 512 and 514.

Moreover, CPU cores 511 and 513 may be heavily pipelined and instructions may go through several layers of decoding at different stages of the pipeline. In this example, instruction decoders 512 and 514 can predecode opcodes into a set of keys that are sufficient to represent the full set of eventual control signal combinations to control the hardware resources available in the CPU's microarchitecture. In this case keys can be defined according to key assignment 400 to simplify the hardware and speed decoding time.

In some embodiments, the key assignment can be dynamic, i.e. it can change over time. In that case, the data compressor would need to periodically send a dictionary defining the lookup function over the medium. In this case the data decompressor could be implemented with a field programmable gate array (FPGA) which would be reconfigured when the dictionary changes.

Some of the functions of lossless data compression system 300 may be implemented with various combinations of hardware and software. For example, lossless data compressor 310 and data decompressor 330 may be implemented partly in software. Some of the software components may be stored in a computer readable storage medium for execution by at least one processor. Moreover the method illustrated in FIG. 4 may also be governed in whole or in part by instructions that are stored in a computer readable storage medium and that are executed by at least one processor. Each of the operations shown in FIG. 4 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

The circuits of FIGS. 3 and 5 or portions thereof may be described or represented by a computer accessible data structure in the form of a database or other data structure which can be read by a program and used, directly or indirectly, to fabricate integrated circuits with the circuits of FIGS. 3 and 5. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits with the circuits of FIGS. 3 and 5. The netlist may then be placed and routed to produce a data set describing geometric shapes to be applied to masks. The masks may then be used in various semiconductor fabrication steps to produce integrated circuits of FIGS. 3 and 5. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the lossless data compression system may be used with a wide variety of media, such as the examples given above or with many other possible media. Moreover the size of the value space and the number of values in the value space will vary in different embodiments. The lossless data compression system may use fixed encoding with an implicit dictionary, or may use dynamic encoding by transmitting a dictionary between the compressor and decompressor from time to time Accordingly, it is intended by the appended claims to cover all modifications of the disclosed embodiments that fall within the scope of the disclosed embodiments.

What is claimed is:

1. A lossless data compressor for a lossless data compression system comprising:
    a hardware-aware encoder for encoding a data value signal into a key signal according to a key assignment formed by:
        determining a number of data values of a value space in which each data value comprises a plurality of bits;
        determining a size of said key to encode said number of data values of said value space;
        grouping said data values into a plurality of groups based on a fewest number of bit differences between data values in each group; and
        assigning fragments of said key based on a fewest number of bits that can differentiate groups based on remaining bits of said data values, and
    a key signal processor having an output adapted to be coupled to a medium for providing a representation of the key signal to said output.

2. The lossless data compressor of claim 1 wherein said key assignment is formed by assigning at least one fragment of said key to a logic state corresponding to a logic state of said bits that can differentiate between said values in said group.

3. The lossless data compressor of claim 1 wherein said hardware aware encoder assigns a next fragment of said key based on said fewest number of bits that can differentiate groups based on remaining bits of data values, until said key identifies all of said data values.

4. The lossless data compressor of claim 1 wherein said medium comprises a memory and said key signal processor comprises a non-volatile memory programmer.

5. The lossless data compressor of claim 1 wherein said medium comprises air and said key signal processor comprises a radio frequency transmitter.

6. The lossless data compressor of claim 5 wherein said hardware-aware encoder comprises a data processor running a software compiler.

7. A lossless data compression system comprising a lossless data compressor and a medium, said lossless data compressor comprising:
- a hardware-aware encoder for encoding a data value signal into a key signal according to a key assignment formed by:
  - determining a number of data values of a value space in which each data value comprises a plurality of bits;
  - determining a size of said key to encode said number of data values of said value space;
  - grouping said data values into a plurality of groups based on a fewest number of bit differences between data values in each group; and
  - assigning fragments of said key based on a fewest number of bits that can differentiate groups based on remaining bits of data values, and
- a key signal processor for providing a representation of said key signal to the medium.

8. The lossless data compression system of claim 7 wherein said key assignment is formed by assigning at least one fragment of said key to a logic state corresponding to a logic state of said bits that can differentiate between said data values in said group.

9. The lossless data compression system of claim 7 wherein said hardware aware encoder forms said key assignment dynamically.

10. The lossless data compression system of claim 7 wherein said key assignment is a static key assignment and said hardware aware encoder uses said static key assignment to convert said data value signal into said key signal.

11. The lossless data compression system of claim 7 further comprising a data decompressor comprising:
- a receiver having an input coupled to the medium, and an output for providing the key signal; and
- an enhanced lookup table having an input coupled to said output of said receiver, and an output for providing said data value signal, wherein said enhanced lookup table converts said key signal to said data value signal using said key assignment.

12. The lossless data compression system of claim 7 wherein the medium comprises a memory and said key signal processor comprises a non-volatile memory programmer.

13. The lossless data compression system of claim 7 wherein the medium comprises air and said key signal processor comprises a radio frequency transmitter.

14. The lossless data compression system of claim 7 wherein said hardware aware encoder comprises a data processor running a software compiler.

15. A method comprising:
- receiving a data value signal;
- encoding said data value signal into a key signal based on a key assignment comprising:
  - determining a number of data values of a value space in which each data value comprises a plurality of bits;
  - determining a size of a key to encode said number of data values of said value space;
  - grouping said plurality of data values into a plurality of groups based on a fewest number of bit differences between data values in each group; and
  - assigning fragments of said key based on a fewest number of bits that can differentiate groups based on remaining bits of data values, and
- providing a representation of said key signal to a medium.

16. The method of claim 15 wherein said assigning said fragments of said key comprises:
- assigning at least one fragment of said key to a logic state corresponding to a logic state of said bits that can differentiate between said data values in said group.

17. The method of claim 15 wherein said providing said representation of said key signal to said medium comprises:
- storing said key signal in a non-volatile storage medium.

18. The method of claim 15 wherein said providing said representation of said key signal to said medium comprises:
- modulating said key signal; and
- transmitting said key signal at a radio frequency over said medium.

19. The method of claim 15 wherein said encoding said data value signal into said key signal further comprises:
- encoding said data value signal into said key signal based on a static key assignment.

20. The method of claim 15 wherein said encoding said data value signal into said key signal further comprises:
- encoding said data value signal into said key signal based on a dynamic key assignment.

* * * * *